(12) United States Patent
Schuelein

(10) Patent No.: US 7,236,032 B2
(45) Date of Patent: Jun. 26, 2007

(54) ULTRA-DROWSY CIRCUIT

(75) Inventor: Mark E. Schuelein, Tempe, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 11/479,239

(22) Filed: Jun. 30, 2006

(65) Prior Publication Data
US 2006/0244493 A1 Nov. 2, 2006

Related U.S. Application Data

(62) Division of application No. 10/881,850, filed on Jun. 29, 2004, now Pat. No. 7,095,255.

(51) Int. Cl.
H03K 3/00 (2006.01)
(52) U.S. Cl. ...................................... 327/218
(58) Field of Classification Search ........ 327/199–201, 327/208, 210–215, 218
See application file for complete search history.

(56) References Cited

U.S. PATENT DOCUMENTS

| 5,228,106 A | 7/1993 | Ang et al. |
| 5,526,314 A | 6/1996 | Kumar |
| 5,804,992 A | 9/1998 | Lee |
| 6,067,264 A | 5/2000 | Kwon |
| 6,433,601 B1 * | 8/2002 | Ganesan ...................... 327/202 |
| 6,639,827 B2 * | 10/2003 | Clark et al. .................. 365/154 |
| 6,775,180 B2 * | 8/2004 | Biyani et al. ................ 365/154 |
| 6,781,421 B2 | 8/2004 | Terzioglu et al. |
| 6,956,421 B1 * | 10/2005 | Schuelein ................... 327/201 |

* cited by examiner

Primary Examiner—My-Trang Nu Ton
(74) Attorney, Agent, or Firm—Kacvinsky, LLC

(57) ABSTRACT

Method and apparatus for an ultra-drowsy circuit for use in lower power operational modes are described.

5 Claims, 3 Drawing Sheets

ULTRA-DROWSY CIRCUIT

The present patent application is a Divisional of application Ser. No. 10/881,850, filed Jun. 29, 2004. now U.S. Pat. No. 7,095,255.

BACKGROUND

Techniques may be available to lower power operation in certain devices, particularly those devices using batteries as the power source. New modes of operation have been incorporated into some devices so as to reduce power usage when the device is not in full operation. For example, a device may be placed in a "sleep mode" when power is shut off to the device when not in operation. In another example, a device may be placed in a "drowsy mode," where the power supply is still on but the voltage is reduced so that the difference between a "1" voltage level and a "0" voltage level is smaller than it would be in normal operation. The circuits supporting such lower power operations, however, may still consume significant amounts of space and power. Reductions in circuit size may further decrease battery size, which may comprise a significant factor in the size and weight of the overall device. Consequently, there may be a need for improvements in power reduction techniques.

DETAILED DESCRIPTION

Figure 1:
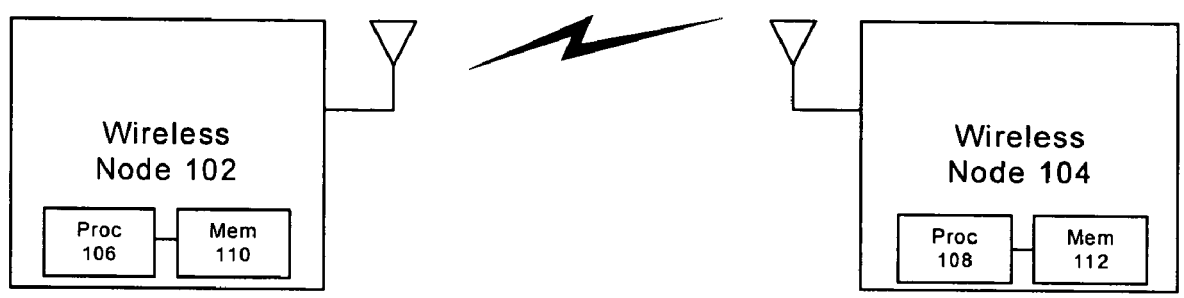
FIG. 1 illustrates a block diagram of a system 100.

FIG. 1 illustrates a block diagram of a system 100. System 100 may comprise, for example, a communication system to communicate information between multiple nodes. The nodes may comprise any physical or logical entity having a unique address in system 100. The unique address may comprise, for example, a network address such as an Internet Protocol (IP) address, device address such as a Media Access Control (MAC) address, and so forth. The embodiments are not limited in this context.

The nodes may be connected by one or more types of communications media. The communications media may comprise any media capable of carrying information signals, such as metal leads, semiconductor material, twisted-pair wire, co-axial cable, fiber optics, radio frequency (RF) spectrum, and so forth. The connection may comprise, for example, a physical connection or logical connection.

The nodes may be connected to the communications media by one or more input/output (I/O) adapters. The I/O adapters may be configured to operate with any suitable technique for controlling communication signals between computer or network devices using a desired set of communications protocols, services and operating procedures. The I/O adapter may also include the appropriate physical connectors to connect the I/O adapter with a given communications medium. Examples of suitable I/O adapters may include a network interface card (NIC), radio/air interface, and so forth.

The general architecture of system 100 may be implemented as a wired or wireless system. If implemented as a wireless system, one or more nodes shown in system 100 may further comprise additional components and interfaces suitable for communicating information signals over the designated RF spectrum. For example, a node of system 100 may include omni-directional antennas, wireless RF transceivers, control logic, and so forth. The embodiments are not limited in this context.

The nodes of system 100 may be configured to communicate different types of information, such as media information and control information. Media information may refer to any data representing content meant for a user, such as voice information, video information, audio information, text information, alphanumeric symbols, graphics, images, and so forth. Control information may refer to any data representing commands, instructions or control words meant for an automated system. For example, control information may be used to route media information through a system, or instruct a node to process the media information in a predetermined manner.

The nodes may communicate the media and control information in accordance with one or more protocols. A protocol may comprise a set of predefined rules or instructions to control how the nodes communicate information between each other. The protocol may be defined by one or more protocol standards, such as the standards promulgated by the Internet Engineering Task Force (IETF), International Telecommunications Union (ITU), Institute of Electrical and Electronics Engineers (IEEE), and so forth.

Referring again to FIG. 1, system 100 may comprise a node 102 and a node 104. In one embodiment, for example, nodes 102 and 104 may comprise wireless nodes arranged to communicate information over a wireless communication medium, such as RF spectrum. Wireless nodes 102 and 104 may represent a number of different wireless devices, such as mobile or cellular telephone, a computer equipped with a wireless access card or modem, a handheld client device such as a wireless personal digital assistant (PDA), a wireless access point, a base station, a mobile subscriber center, a radio network controller, and so forth. In one embodiment, for example, nodes 102 and/or 104 may comprise wireless devices developed in accordance with the Personal Internet Client Architecture (PCA) by Intel® Corporation. Although FIG. 1 shows a limited number of nodes, it can be appreciated that any number of nodes may be used in system 100. Further, although the embodiments may be illustrated in the context of a wireless communications system, the principles discussed herein may also be implemented in a wired communications system as well. The embodiments are not limited in this context.

In one embodiment, nodes 102 and 104 may each include a processing system having a processor and memory. For example, node 102 may include a processor 106 and memory 110, and node 104 may include a processor 108 and memory 112. Examples for processors 106 and 108 may include a general-purpose processor such as made by Intel® Corporation, or a dedicated processor such as a digital signal processor (DSP), network processor, embedded processor, micro-controller, controller and so forth. Examples for memory 110 and 112 may include any machine-readable media, such as read-only memory (ROM), random-access memory (RAM), synchronous RAM (SRAM), dynamic RAM (DRAM), synchronous DRAM (SDRAM), flash memory, magnetic disk (e.g., floppy disk and hard drive), optical disk (e.g., CD-ROM), and so forth. The embodiments are not limited in this context.

In one embodiment, nodes 102 and 104 may comprise wireless devices having a power source such as a direct current (DC) battery. As a result, nodes 102 and 104 may operate at various levels of power in an attempt to conserve battery power. Consequently, nodes 102 and 104 may be placed in lower power operation modes in accordance with a number of different power reduction techniques. For example, lower power operation modes may include sleep mode, drowsy mode, and so forth. When placed in lower power operation modes, nodes 102 and 104 may need to conserve state for various volatile memory elements, such as memory 110 and 112. Consequently, memory cells or elements of memory 110 and 112 may use an ultra-drowsy latch element implemented using an ultra-drowsy state retention circuit to place memory 110 and 112 into an "ultra-drowsy" mode. The ultra-drowsy latch element may be useful in devices having lower power designs that need to retain state while switching power off to reduce leakage. Leakage may refer to the static power consumption of an element. In one embodiment, for example, the ultra-drowsy latch element may be arranged to provide logic state retention during power down modes. It may use a combination of low leakage devices and high speed devices, with the low leakage devices to preserve state while the high performance devices maintain speed during normal operations. This may be accomplished using cross-coupled gates at the core of the latch to provide isolation from the normal power rail to enable it to be turned off. An ultra-drowsy state retention circuit may be described in more detail with reference to FIG. 2, while the ultra-drowsy latch element implemented using an ultra-drowsy state retention circuit may be described in more detail with reference to FIG. 3.

Figure 2:
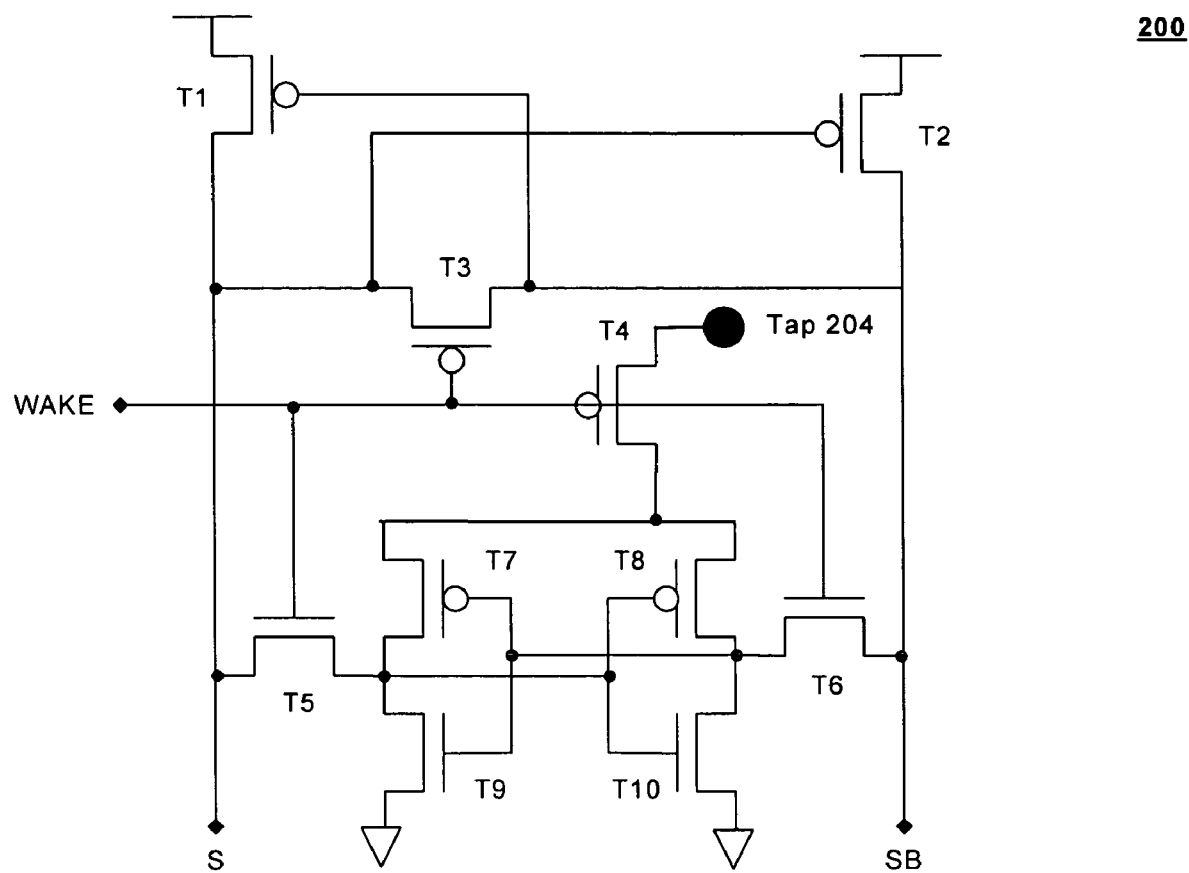
FIG. 2 illustrates a schematic diagram of a circuit 200.

FIG. 2 illustrates a schematic diagram of a circuit 200. Circuit 200 may comprise an ultra-drowsy state retention circuit for use in one or more memory elements for nodes 102 and/or 104. As shown in FIG. 2, circuit 200 may comprise 10 transistors, including 6 positive-channel metal-oxide semiconductor (PMOS) transistors T1, T2, T3, T4, T7 and T8, and 4 negative-channel MOS (NMOS) transistors, T5, T6, T9 and T10. Circuit 200 may receive as an input signal WAKE, and may output two output signals S and SB.

In one embodiment, circuit 200 may include pull-up transistors T1 and T2. Transistors T1 and T2 may comprise faster and leakier elements compared to the other transistors of circuit 200. All the other transistors of circuit 200, however, may be implemented using lower leakage elements. As shown in FIG. 2, transistor T1 may have a gate connected to a drain for transistor T2. The drain of transistor T1 may output a signal S. The source for transistor T1 may be connected to a first power supply, such as VCC, for example. Transistor T2 may have a gate connected to the drain of transistor T1. The drain of transistor T2 may output a signal SB. The source of transistor T2 may be connected to the first power supply.

In one embodiment, circuit 200 may include equalizing transistor T3. Transistor T3 may have a gate connected to an input signal WAKE. The source of transistor T3 may be connected to the signal SB. The drain of transistor T3 may be connected to the signal S.

In one embodiment, circuit 200 may include a power gate transistor T4. Transistor T4 may have a gate to receive an input signal WAKE. The source of transistor T4 may be connected to a second power supply via well tap 204. The drain of transistor T4 may be connected to a third power supply, such as ground.

In one embodiment, circuit 200 may include pass gate transistors T5 and T6. Transistor T5 may have a gate connected to input signal WAKE. The source of transistor T5 may be connected to the drain of transistor T1. The drain of transistor T5 may be connected to the commonly connected drains of transistors T7 and T9. Transistor T6 may have a gate connected to input signal WAKE. The source of transistor T6 may be connected to the drain for transistor T2. The drain of transistor T6 may be connected to the commonly connected drains of transistors T8 and T10.

In one embodiment, circuit 200 may include transistors T7, T8, T9 and T10. Transistors T7, T8, T9 and T10 may be arranged as a pair of cross coupled inverters. The cross coupled inverters may operate similar to a flip-flop storing a bit while the first power supply is turned off. The gates of transistors T7 and T9 may be connected, and the drain of transistor T7 may be connected to the drain for transistor T9. The commonly connected gates of transistors T7 and T9 may be connected to the drain for transistor T6, as well as the commonly connected drains of transistors T8 and T10. Similarly, the gates of transistors T8 and T10 may be connected, and the drain of transistor T8 may be connected to the drain of transistor T10. The commonly connected gates of transistors T8 and T10 may be connected to the drain for transistor T5, as well as the commonly connected drains of transistors T7 and T9. The source of transistor T9 and the source of transistor T10 may each be connected to a power conductor to receive a voltage potential such as ground, for example. The source of transistor T7 and the source of transistor T8 may each be connected to the second power supply.

In operation, circuit 200 may allow logic state to be retained in low leakage devices during a power down mode. In a power down mode, it may be desirable to power down most of the elements of a node except for some memory elements. Circuit 200 may be used for such memory elements. As shown in FIG. 2, circuit 200 may output two signals S and SB. If one side of circuit 200 is pulled to ground, a first output may output a signal S comprising a "1" voltage level ("logic 1" or "assert high"), and a second output may output a signal SB comprising a "0" voltage level ("logic 0" or "assert low"). If the other side of circuit 200 is pulled to ground, output signal S may output logic 0 and output signal SB may output logic 1. The outputs of circuit 200 may maintain the same state until one side is pulled to ground.

In one embodiment, WAKE may comprise a signal to indicate the mode of operation for circuit 200, with a logic 1 to represent a normal operational mode and logic 0 to represent a state retention mode. Transistor T4 disconnects P devices T7 and T8 in the cross coupled inverters during normal operational mode, and connects them to power through a well tap 204 during state retention mode. Transistor T3 may be turned off during normal operational mode, and forces approximately equal voltages on S and SB prior to WAKE switching back to normal operational mode from state retention mode. This helps ensure a robust awakening from the ultra drowsy condition of state retention mode.

During state retention mode transistors T5 and T6 isolate the cross coupled inverters from the rest of circuit 200, and transistor T4 supplies power for the cross coupled inverters so they can retain the current state. The voltage on the normal supply is removed to conserve power in the rest of circuit 200, and the cross coupled inverters receive their power from the N-Well through well tap 204 and transistor T4. Transistor T3 may be turned on to balance the voltage between S and SB, although T3 may be omitted in other embodiments. As WAKE goes back to logic 1, pass gate transistors T5 and T6 may be turned on and allow the cross coupled inverters to re-establish the state on S and SB.

In normal operational mode power is removed from transistors T7 and T8 in the cross coupled inverters, but power is made available to transistors T1 and T2. Transistors T5 and T6 may be turned on and allow transistors T1 and T2 to replace the un-powered transistors T7 and T8. In normal operational mode, circuit 200 operates similar to cross coupled inverters powered from the regular power rail with pull-ups provided by transistors T1 and T2. Since transistors T1 and T2 are faster elements, they are able to provide the speed advantages desired in normal operational mode.

As described above, some embodiments utilize T3 and T4. It may be appreciated, however, that T3 and T4 are optional, and one or both may be omitted and still fall within the scope of the embodiments.

Figure 3:
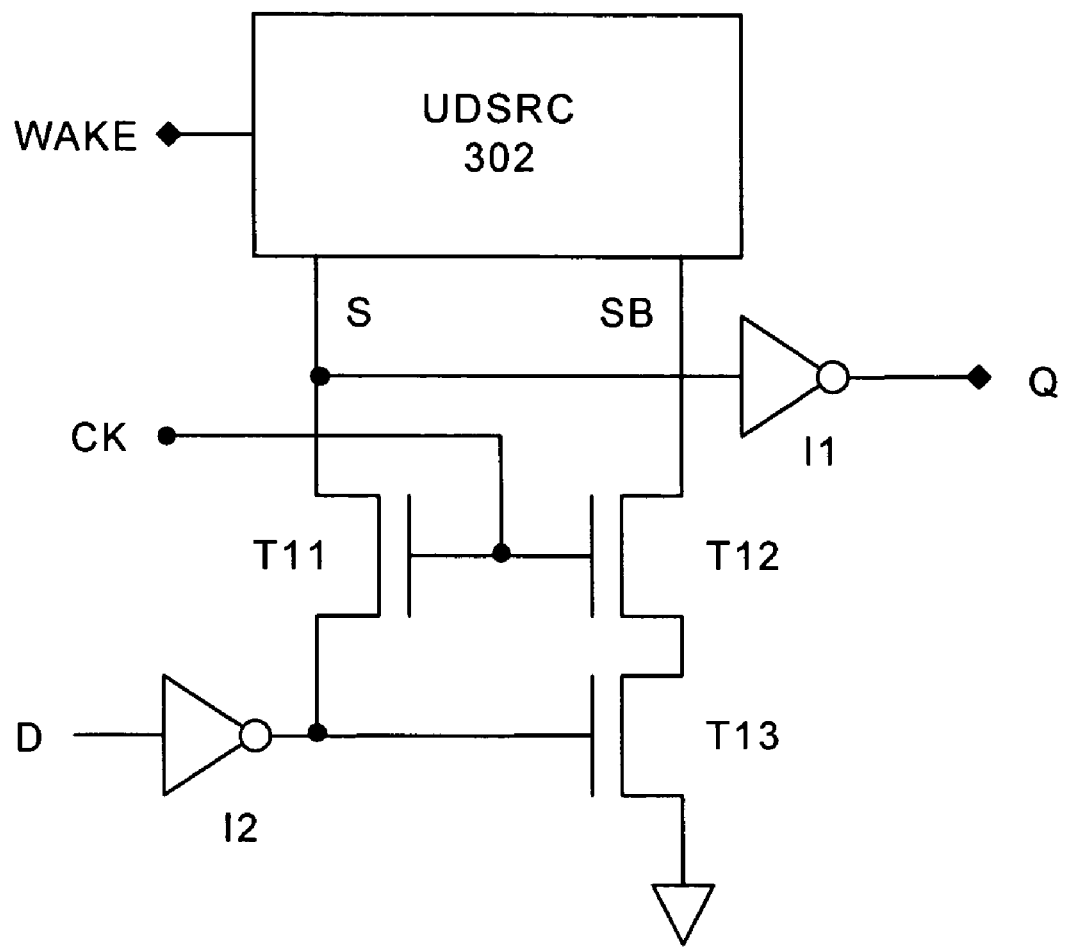
FIG. 3 illustrates a schematic diagram of a circuit 300.

FIG. 3 illustrates a schematic diagram of a circuit 300. Circuit 300 may comprise an ultra-drowsy latch element implemented using, for example, an ultra-drowsy state retention circuit similar to circuit 200. Circuit 300 may include a UDSRC 302, N transistors T11, T12 and T13, and inverters I1 and I2. In one embodiment, UDSRC 302 may be similar to circuit 200 described with reference to FIG. 2. UDSRC 302 may receive a signal WAKE. When WAKE is logic 1 then UDSRC 302 may be placed in a normal operational mode. When WAKE is logic 0 then UDSRC 302 may be placed in a state retention mode.

In one embodiment, circuit 300 may include transistor T11, T12 and T13. Transistor T11 may have a gate connected to a gate for transistor T12. The commonly connected gates of transistors T11 and T12 may receive an input signal CK. A source for transistor T11 may be connected to a first output S of UDSRC 302. A drain for transistor T11 may be connected to an output for inverter I2. A drain for transistor T12 may be connected to a second output SB of UDSRC 302. A source for transistor T12 may be connected to a drain for transistor T13. A gate for transistor T13 may receive the output for inventor I2. A source for transistor T13 may be connected to a power conductor to receive a voltage potential such as ground, for example.

In one embodiment, circuit 300 may include inverters I1 and I2. Inverter I1 may receive as input the first output signal S, and output a signal Q. Inverter I2 may receive as input a signal D, and output a signal to the gate for transistor T13.

In one embodiment, when signal CK is logic 0, then transistors T11 and T12 are turned off and UDSRC 302 remains unchanged. When signal CK is logic 1, transistor T13 is turned on, thereby allowing S or SB to be pulled to ground, as controlled by signal D via inverter I2. When signal D is logic 1, then T11 is turned on thereby allowing S to be pulled to ground. When signal D is logic 0, then T12 is turned on thereby allowing SB to be pulled to ground.

The ultra-drowsy techniques described herein may provide several power reduction advantages. For example, circuit 200 may be implemented using a lower number of low leakage devices (e.g., 7–8), which may conserve silicon area. In another example, circuit 200 may be implemented as part of a normal flop as shown in circuit 300, with virtually the same performance since the speed path uses faster devices. This may be contrasted with conventional designs where an additional latch and control logic may be needed to implement a flop. In yet another example, control of circuit 200 is less complex relative to conventional designs. Circuit 200 may lower WAKE to logic 0 and shut off power to start state retention mode. Circuit 200 may be returned to normal operational mode by restoring power and raising WAKE to logic 1. Conventional designs may require two or more signals for switching between various modes, and may also have timing constraints to insure supply power was removed completely before coming out of the state retention mode. In still another example, conventional designs may require a separate power line connected to each latch, while circuit 200 obviates this requirement. Consequently, the ultra-drowsy techniques described herein may result in significant reductions in cost and power consumption. For example, circuit 200 may save up to 10% die area on some chips with comparable savings in stand-by leakage power.

Numerous specific details have been set forth herein to provide a thorough understanding of the embodiments. It will be understood by those skilled in the art, however, that the embodiments may be practiced without these specific details. In other instances, well-known operations, components and circuits have not been described in detail so as not to obscure the embodiments. It can be appreciated that the specific structural and functional details disclosed herein may be representative and do not necessarily limit the scope of the embodiments.

It is worthy to note that any reference to "one embodiment" or "an embodiment" means that a particular feature, structure, or characteristic described in connection with the embodiment is included in at least one embodiment. The appearances of the phrase "in one embodiment" in various places in the specification are not necessarily all referring to the same embodiment.

All or portions of an embodiment may be implemented using an architecture that may vary in accordance with any number of factors, such as desired computational rate, power levels, heat tolerances, processing cycle budget, input data rates, output data rates, memory resources, data bus speeds and other performance constraints. For example, an embodiment may be implemented using software executed by a processor. In another example, an embodiment may be implemented as dedicated hardware, such as a circuit, an application specific integrated circuit (ASIC), Programmable Logic Device (PLD) or DSP, and so forth. In yet another example, an embodiment may be implemented by any combination of programmed general-purpose computer components and custom hardware components. The embodiments are not limited in this context.

In the description and claims, the terms "coupled" and "connected," along with their derivatives, may be used. It should be understood that these terms are not intended as synonyms for each other. Rather, in particular embodiments, "connected" may be used to indicate that two or more elements are in direct physical or electrical contact with each other. "Coupled" may mean that two or more elements are in direct physical or electrical contact. The term "coupled", however, may also mean that two or more elements are not in direct contact with each other, but yet still co-operate or interact with each other. The embodiments are not limited in this context.

The invention claimed is:

1. A circuit, comprising:
   a state retention circuit to receive a mode selection signal and having a first output to output a first output signal and a second output to output a second output signal, with said first output signal comprising an inverse of said second output signal;
   a first inverter to receive said first output signal and having a third output to output a third output signal;
   a second inverter to receive a first input signal and having a fourth output to output a fourth output signal; and
   first, second and third transistors, said first transistor having a gate coupled to a gate for said second transistor, said commonly coupled gates of said first and second transistors to receive a second input signal, said first transistor further having a drain coupled to said first output and a source coupled to said fourth output, with said second transistor having a drain coupled to said second output and a source coupled to a drain for said third transistor, said third transistor having a gate coupled to said fourth output.

2. The circuit of claim 1, wherein said first and second transistors can be turned off to isolate said state retention circuit when said second input signal is asserted low.

3. The circuit of claim 1, wherein said second input signal is asserted high to allow one of said first transistor and said second transistor to conduct electricity in response to said first input signal.

4. The circuit of claim 3, wherein said first transistor can be turned on when said first input signal is asserted high to allow said first output signal to be pulled to ground.

5. The circuit of claim 3, wherein said second transistor can be turned on when said first input signal is asserted low to allow said second output signal to be pulled to ground.

* * * * *